United States Patent [19]

Prince et al.

[11] Patent Number: 5,510,215
[45] Date of Patent: Apr. 23, 1996

[54] METHOD FOR PATTERNING MULTILAYER DIELECTRIC COLOR FILTER

[75] Inventors: Eric T. Prince, Fairport; Michael J. Hanrahan, Hilton; Sharlene A. Wilson, Seneca Falls, all of N.Y.

[73] Assignee: Eastman Kodak Company, Rochester, N.Y.

[21] Appl. No.: 378,211

[22] Filed: Jan. 25, 1995

[51] Int. Cl.$^6$ ................................................ G03F 9/00
[52] U.S. Cl. ............................ 430/7; 430/20; 430/322; 359/885; 359/359; 359/586
[58] Field of Search ............................ 430/7, 20, 321, 430/322; 359/885, 359, 360, 586, 588

[56] References Cited

U.S. PATENT DOCUMENTS

| | | | |
|---|---|---|---|
| 4,315,978 | 2/1982 | Hartman | 430/4 |
| 4,534,620 | 8/1985 | Gale et al. | 350/166 |
| 4,808,510 | 2/1989 | Snow et al. | 430/287 |
| 5,337,191 | 8/1994 | Austin | 359/885 |

OTHER PUBLICATIONS

"Fabrication of Mosaic Color Filters by Dry–Etching Dielectric Stacks", by B. J. Curtis, M. T. Gale, H. W. Lehmann, H. Brunner, H. Schuetz and R. Widmer, J. American Vacuum Sci. Tech A, vol. 4, No. 1, Jan./Feb. 1986, pp. 70–74.

*Primary Examiner*—S. Rosasco
*Attorney, Agent, or Firm*—Raymond L. Owens

[57] ABSTRACT

A method of patterning a multilayer, dielectric color filter is described. The method includes depositing a multilayer, dielectric color filter on a substrate having top, bottom and multiple intermediate layers; and applying a patternable mask onto the top layer to provide selected openings through the mask. The method further includes removing the top layer through the selected openings in the patterned mask using a first dry etch, the patterned mask and the multiple intermediate layers of the filter being resistant to this first dry etch, to provide openings to the multiple intermediate layers of the filter. It is a feature of the invention to remove the patterned mask using a second dry etch, the top layer and multiple intermediate layers of the filter being resistant to this second dry etch; and to remove through the openings in the top layer the multiple intermediate layers of the filter, down to the bottom layer, using a third dry etch, the top layer and bottom layer being resistant to this third dry etch.

20 Claims, 4 Drawing Sheets

METHOD FOR PATTERNING MULTILAYER DIELECTRIC COLOR FILTER

FIELD OF INVENTION

This invention relates a method for patterning a multilayer, dielectric color filter.

BACKGROUND OF THE INVENTION

Multilayer, dielectric color filters have applications in numerous areas, e.g., radiometry, colorimetry, spectroscopy, laser communications, etc. One application which has emerged recently is in the area of color separation for solid-state color cameras. In this application color filters are used for encoding color images captured by solid-state cameras having single, or multiple, image sensor chips.

In a multi-chip color camera, images are split optically (using beamsplitters) into multiple images (typically three). Each image is directed through a color filter and projected onto one of several, identical, sensor chips. A different filter is used with each sensor chip to split the image into component colors; either (or combination of) primary colors, Red-Green-Blue (RGB), or secondary colors, Cyan-Magenta-Yellow (CMY). Because the filters are discrete (i.e., not an integral part of the image sensor chips) and considerably larger than the optically sensitive elements (i.e., pixels) in the sensor chips, a number of different type color filters, including multilayer dielectric color filters, may be used. Encoding is accomplished, in general, one color per chip. Each chip captures the same image, at the same time, with the same number of pixels. Pixel-to-pixel registration is established between chips and provides the component colors of the image at each pixel location.

In a single-chip color camera, images are captured by either single or multiple exposure(s). Images captured by multiple exposures are separated into component colors by use of multiple filters. One color is captured per filter per exposure. Multilayer, dielectric color filters, unpatterned, are typically the filter type of choice in this application although a number of different filter types may be used. Images captured by single exposure are separated into several (typically three), non-overlapping, one-dimensional or two-dimensional patterns and encoded one component color per pattern. Only one component color of the image is captured per pixel location. Color filters must be patterned to cover individual (or linear arrays of) pixels to permit suitable sampling of spatial color. Often, the process used to pattern the filters imposes constraints on the type of color filter which can be used. Color information is recovered through electronic demultiplexing.

Of the solid-state color cameras available, the single-chip camera, which captures images by single exposure, offers the least system complexity and lowest cost. It suffers, however, in terms of image quality when compared to other solid-state cameras having sensor chips of similar pixel density. Only one component color is captured per pixel location instead of three. This lack of information lowers the effective resolution of the sensor and increases the number of artifacts introduced through sampling. Of course, an improvement in effective resolution can be realized, and artifacts minimized, by increasing the pixel density, i.e., information content per unit area, of the chip. Constraints imposed by current technology, however, limit the extent to which this can be achieved. New technology must be developed to apply and pattern discrete color filters on pixels smaller than those available currently in state-of-the-art, color image sensors, ca. 5 µm×5 µm.

In general, the color filters used in single-chip cameras are organic-based, patternable layers which incorporate dyes to provide color separation. See, for example, U.S. Pat. Nos. 4,315,978 (Hartman et al) and 4,808,510 (Pace et al). In comparison to multilayer, dielectric color filters, the organic dye filters are less durable (i.e., softer); exhibit lower transmittance, especially in the blue portion of the visible spectrum; have lower thermal stability; and bleach or degrade with time. Also, their spectral characteristics are fixed and cannot be taylored or optimized for specific sensors or applications.

Multilayer, dielectric color filters are, therefore, the preferred type filter for application in single-chip color cameras. They are, however, increasingly difficult to form in small, pixel-sized elements as pixel size decreases. The conventional method of forming multilayer, dielectric color filters for sensors in single-chip cameras involves the use of lift-off processing. With this approach a separate lift-off process is used for each component color to pattern filters deposited by evaporation directly onto sensors or onto glass for subsequent attachment to sensors. As shown schematically in the cross-section views of FIG. 1, the lift-off pattern is formed first in a layer of photoresist 110 on substrate 120 (FIG. 1A). The multilayer, dielectric color filter 130 is next deposited over this lift-off pattern (FIG. 1B). Finally, the photoresist 110 is dissolved away with a suitable photoresist remover to 'lift-off' all unwanted material (FIG. 1C). While this technique is useful to pattern a wide variety of materials, it offers two main disadvantages when used for patterning multilayer, dielectric color filters:

1. Shadowing, which occurs during deposition of the filters, produces filters with rounded edges. Rounded edges reduce the useable width of the filters by an amount which depends on the initial height of the lift-off pattern and the geometry of the deposition system. A width reduction of 1 µm (0.5 µm from each edge) or more is not uncommon.

2. In a lift-off process, the temperature during deposition of filters is limited to below the temperature at which the photoresist begins to deform or degrade, i.e., typically less than 150° C. Often, this limitation prevents the deposition of filters which are fully dense and non-absorbing.

Another method for patterning multilayer, dielectric color filters for sensors in single-chip cameras, which avoids the disadvantages described above for the lift-off process, involves the use of an anisotropic etch. An anisotropic etch is an etch which attacks the filters faster in the direction normal to their surface than in a direction parallel to their surface. In this method, as shown schematically in the cross-section views of FIG. 2, a multilayer, dielectric color filter 210 is deposited on substrate 220 (FIG. 2A), covered by a patterned mask 230 (FIG. 2B) and etched (FIG. 2C). Finally, the patterned mask 230 is removed (FIG. 2D). This method permits the formation of filters with near vertical sidewalls, i.e., with little edge rounding and more useable surface area. It also separates the deposition from the patterning process permitting deposition of filters at higher temperatures with improved material properties.

Successful demonstrations of this method from a single research/development effort are described by Gale et al [U.S. Pat. No. 4,534,620] and Curtis et al [J. Vac. Sci. Technol. A 4(1), 70 (1986)]. In these demonstrations two multilayer, dielectric color filters (yellow and cyan) were utilized; one deposited on top of the other on glass substrates. The filters were patterned using dry etch processing to form regions comprised of green (yellow plus cyan), yellow or cyan, and white. Gale et al describe the top layer of the bottom filter as composed of a material (e.g., $TiO_2$) which is inert to a given wet etchant (e.g., HF or concentrated HCl with small amounts of Zn powder added to produce nascent $H_2$) and the bottom layer of the top filter as composed of a material (e.g., $SiO_2$ or $SnO_2$) which is etched by the given wet etchant ($SiO_2$ by HF, $SnO_2$ by concentrated HCl with small amounts of Zn powder). The remaining portions of the filters were composed of alternate layers of $TiO_2$ and $SiO_2$. Using photoresist as the mask an anisotropic, dry etch process (i.e., reactive sputter etching in $CHClF_2$) was used to pattern the filters by removal of the top (yellow or cyan) filter and both (cyan and yellow) filters from selected regions. During patterning of the top filter the anisotropic dry etch was stopped inside the bottom layer (which was composed of either $SiO_2$ or $SnO_2$). The remainder of the bottom layer was removed by wet etching to expose the top layer of the bottom filter. (The top layer of the bottom filter being inert to the wet etch, was exposed but not attacked.) The dry etch through the bottom filter was stopped once inside the glass substrate.

An alternative demonstration of the above method is described in both Curtis et al and Gale et al wherein the remainder of the bottom layer of the top filter (i.e., $SiO_2$), left behind by the dry etch, was left intact and not removed by wet etch. An epoxy overcoat with refractive index matching that of the $SiO_2$ layer was applied over the patterned filter.

The patterning achieved through the top (yellow or cyan) and bottom (cyan or yellow) filters was claimed to provide an edge definition (separation between adjacent filters due to sidewall slope) for all filters of better than 1 µm. The thickness of the top filter (10 layers) with a 0.1450 µm thick, $SiO_2$, bottom layer was 0.5734 µm. The thickness of the corresponding bottom filter (9 layers) was 0.7208 µm. The thickness of the top filter (9 layers) with a 0.1236 µm thick, $SnO_2$, bottom layer was 0.7412 µm. The thickness of the corresponding bottom filter (9 layers) was 0.4360 µm. The depth of the dry etch was controlled by in-situ reflectance monitoring.

Unfortunately, a number of limitations arise when attempts are made to utilize the methods described by Gale et al and Curtis et al to pattern multilayer, dielectric filters of random color in a general manufacturing process:

1. The thickness of, and number of layers in, a multilayer, dielectric color filter are determined by the materials used and the spectral characteristics required by the application. In Gale et al and Curtis et al the spectral characteristics required by the application allowed use of $SiO_2/TiO_2$ filters of thickness less than 0.75 µm with 10 or fewer layers. Each filter was patterned using photoresist as the dry etch mask. In general practice, however, multilayer, dielectric filters of thickness greater than 0.75 µm are often required. For example, filters used in electronic cameras which scan photographic films may easily approach or exceed 3 µm in thickness. Patterning of filters in this regime of thickness can require, depending on the selectivity of the dry etch (i.e., etch rate of a material relative to that of the mask), photoresist masks of thickness greater than that obtained (ca. 0.3–2 µm) in a single spin-coat application. Multiple coatings may be required. As the thickness of the photoresist mask increases, the resolution of a dry etch and the accuracy to which edges can be defined, both decrease. Photoresist, therefore, is not the ideal mask for use in achieving optimum edge definition for general patterning of thick, multilayer, dielectric color filters.

2. In any dry etch (reactive sputter etch, reactive ion etch (RIE), ion beam etch, etc.), batch or single wafer process, variations in etch depth occur over the active area of the etch system. For maximum throughput during an etch process the maximum amount of active area must be utilized. When attempting to stop an etch in a specific, etchable layer of a multilayer, dielectric filter (when the active area of the etch system is covered by such filters) variations in etch depth occur which cause variations in the performance of resultant filters. Some means to uniformly stop the etch, i.e., provide an etch-stop, is required. Gale et al demonstrated two approaches to address this issue utilizing the bottom layer of the top filter as the etch-stop. (i) The dry etch was stopped in the bottom layer when composed of $SiO_2$ and the remaining $SiO_2$ was removed by a wet chemical etch. The wet chemical etch was chosen such that it did not attack the top layer (i.e., $TiO_2$) of the bottom filter. With the bottom layer of the top filter composed of $SiO_2$ the dry etch was carefully monitored (by in-situ optical monitoring) and stopped in this layer. The dry etch was not highly selective between this layer and the underlying layer of $TiO_2$ so, without care, the $TiO_2$ would etch upon overshoot. Also the wet chemical etch, when used to remove the remainder of the $SiO_2$ layer, would, due to its isotropic nature, attack all $SiO_2$ layers in the top filter inward from the edges. This reduced useable filter area. (ii) To reduce the problems associated with $SiO_2$ as the bottom layer of the top filter the $SiO_2$ was replaced by $SnO_2$. No mention was made as to the selectivity of this material with respect to $TiO_2$ in the dry etch and the wet etch used to remove the $SnO_2$, although not reactant with $SiO_2$ or $TiO_2$, required careful control to prevent undercut of the the top filter (inward from the edges).

The use of isotropic wet etchants to remove the remainder of the bottom layer of the top filter without attacking the top layer of the bottom filter is not an optimum solution to achieving maximum useable filter area and edge definition. There are no means to prevent isotropic wet etches from undercutting the top filter inward from the edges. Both Gale et al and Curtis et al appear to have realized this as they describe an alternate method whereby use of a wet etch to remove the remainder of the bottom layer of the top filter is avoided. In this method the remainder of the bottom layer is not removed but, instead, left intact and covered by a polymer layer of similar refractive index. This method, although a reasonable alternative to the use of a wet chemical etch, is not universally applicable. It cannot, for example, be applied to the patterning of single filters when additional filters are subsequently deposited into the patterned openings.

SUMMARY OF THE INVENTION

It is an object of the present invention to relate a method for patterning a multilayer, dielectric color filter.

This object is achieved in a method of patterning a multilayer, dielectric color filter comprising the steps of:

a) depositing a multilayer, dielectric color filter on a substrate having top, bottom and multiple intermediate layers;

b) applying a patternable mask onto the top layer to provide selected openings through the mask;

c) removing the top layer through the selected openings in the patterned mask, the patterned mask and the multiple intermediate layers of the filter being resistant to the process used for removing the top layer, to provide openings to the multiple intermediate layers of the filter; and d) removing, through the openings in the top layer, the multiple intermediate layers of the filter, down to the bottom layer, the top layer and bottom layer being resistant to the process used for removing the intermediate layers.

When the top layer which serves as an etch stop cannot be incorporated in the filter design due to constraints imposed by the application it can be removed along with the bottom layer where exposed through openings in the top layer by again using the process employed in step (c).

It is preferred that the patterning steps (c) and (d) be accomplished by dry etch processing.

Advantages

Multilayer, dielectric color filters of improved resolution and edge definition can be patterned by dry etch processing on any suitable substrate when made in accordance with this invention. The dry etch processing provides anisotropy which maximizes the useful area of patterned filters by producing features with vertical or near vertical sidewalls. By using: (i) a mask which is patternable by dry etch processing and more resistant to attack during the dry etching of filter layers than photoresist; and (ii) an etch-stop layer which is integral to the filter and removable by dry etch processing without undercutting the filter; the patterning of multilayer, dielectric color filters is permitted into features smaller than allowed by previously applied lift-off or dry/wet etch processes. The integral etch-stop layer prevents under or over etching and ensures that consistent etch profiles are obtained on all filters positioned inside the active area of a dry etch system. The filters can be applied directly to the devices on which they are used or indirectly to glass substrates for subsequent attachment to these devices. Devices with which patterned, multilayer, dielectric color filters can be used include projection systems, displays and printers, in addition to the aforementioned application to solid-state image sensors.

DETAILED DESCRIPTION OF THE PREFERRED EMBODIMENTS

Figure 1A:
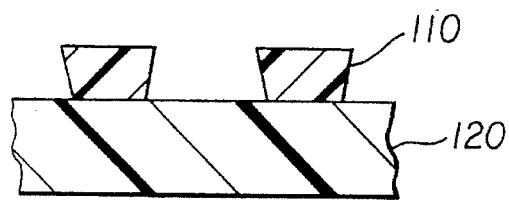
FIGS. 1A–C are sectional views illustrating the steps required in a typical process for patterning a multilayer, dielectric color filter using lift-off processing.
Figure 2A:
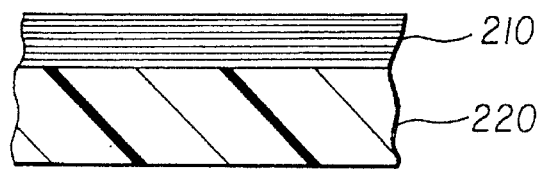
FIGS. 2A–D are sectional views illustrating the steps required in a typical process for patterning a multilayer, dielectric color filter using an anisotropic, dry etch process.
Figure 1B:
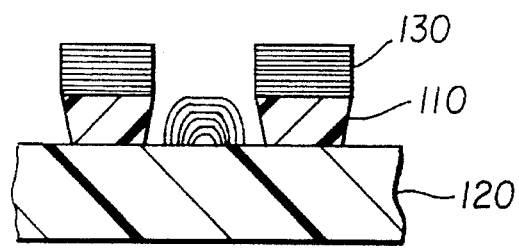
Figure 2B:
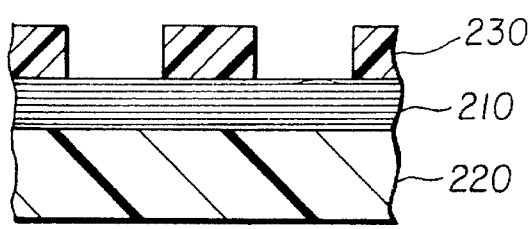
Figure 1C:
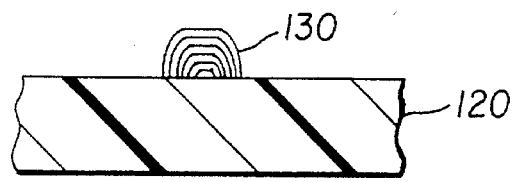
Figure 2C:
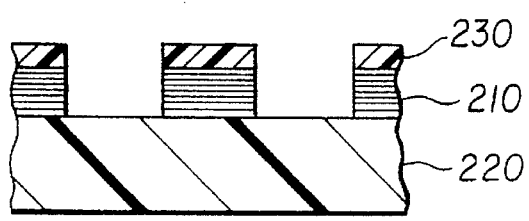
Figure 2D:
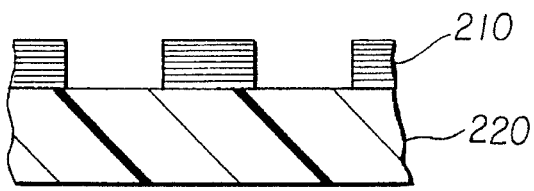
Figure 3A:
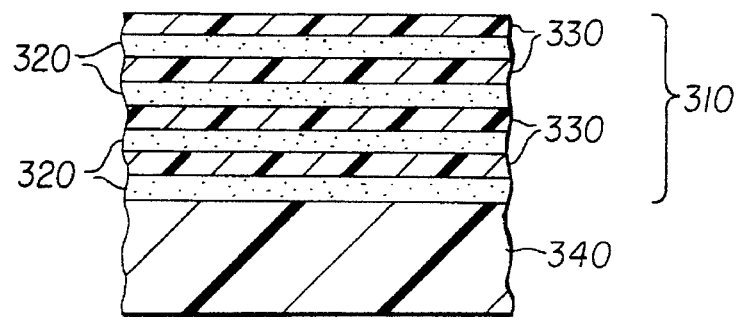
FIGS. 3A–C are sectional views illustrating, respectively: a conventionally formed multilayer, dielectric color filter; a multilayer, dielectric color filter with one, integral, etchstop layer; and a multilayer, dielectric color filter with two, integral, etch-stop layers according to the present invention.

A typical, conventionally formed, multilayer, dielectric color filter is shown in FIG. 3A containing multiple alternate layers 310 of two inorganic materials; one of high refractive index 320 and the other of low refractive index 330, e.g., $TiO_2/SiO_2$, $Ta_2O_5/SiO_2$, or $ZnS/MgF_2$, each having low optical absorption on a suitable substrate 340. The thicknesses of the individual layers are determined by the required spectral characteristics of the filter using techniques well known to those skilled in the art. The patterning of this type filter by dry etch processing into small features with vertical or near vertical sidewalls demands an etch which provides significant anisotropy. The etch must also be capable of removing each of the dielectric materials comprising the multiple alternate layers in clean fashion without leaving 'grass' or residue in etch regions. From the demonstrations described by Gale et al [U.S. Pat. No. 4,534,620] and Curtis et al [J. Vac. Sci. Technol. A 4(1), 70 (1986)] reactive sputter etching is capable of successfully patterning filters composed of multiple alternate layers of $TiO2$ and $SiO_2$ using $CHClF_2$. (Actually, in arriving at this choice of reactive gas $CHF_3/Cl_2$ and $CHF_3/CHClF_2$ gas mixtures were also investigated.) The major disadvantage in using a single reactive gas or multiple reactive gas mixture to pattern multilayer, dielectric color filters by dry etch processing is the difficulty encountered when attempting to stop the etch in a particular etchable layer. An over or under etch is likely to occur in some filter (or filters) somewhere within the active area of the etch system.

Figure 3B:
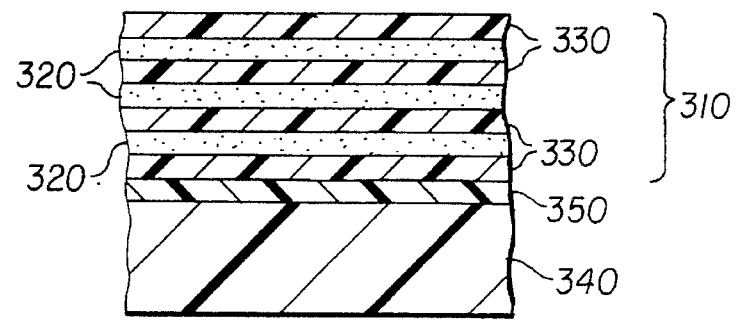
Figure 3C:
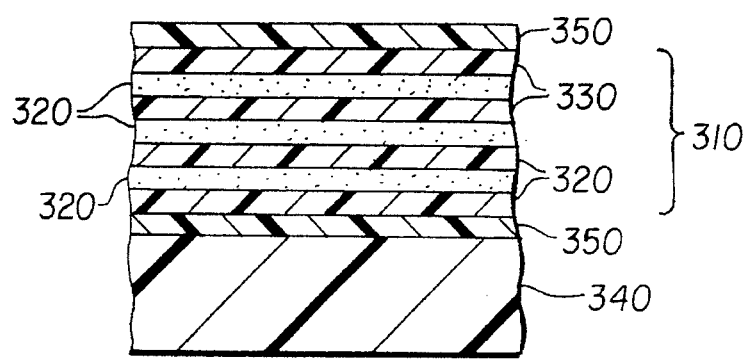

This invention relates a method of patterning a multilayer, dielectric color filter composed of at least three, different, inorganic, dielectric materials (first material, second material, third material) having low optical absorption over the spectral range of interest. Suitable dielectric materials exclude metallic conductors but may include semiconductors with measureable electrical conductivity. The third material, which is easily designed into the filter, serves as an etch-stop and an etch mask for a dry etch process that removes multiple layers of the first and second materials. The third material is resistant to attack by this etch process and, conversely, the first and second materials are resistant to attack by the dry etch process which removes the third material. In a typical application of this invention, multilayer, dielectric color filters incorporate the third material 350 as the bottom layer in the multilayer stack (FIG. 3B). If allowed by the application this third material may also be incorporated as the top layer of the multilayer stack (FIG. 3C). The incorporation of the third layer at other positions in the filters is not precluded, however, for applications as yet unforeseen.

The process by which these filters are formed begins with the deposition (typically by e-beam evaporation) of the bottom layer of the third material. Materials such as indium oxide (In2O3) and indium-tin-oxide (ITO) have been used with success but other materials not yet identified may be equally or even more suitable. ITO and In2O3 are among a class of materials known as transparent conducting oxides. These materials are semiconductors of high energy gap with and without incorporated dopant, respectively. Under appropriate deposition conditions the optical absorption in these materials can be reduced sufficiently to permit their use in this application. On top of this bottom layer alternate layers of the first and second materials (one of high refractive index and the other of low refractive index) are deposited. The material combinations: $TiO_2/SiO_2$ and $Ta_2O_5/SiO_2$ have been used with success but other combinations not yet identified may also be found to work. It is preferred from the standpoint of filter design, but not required, that the refractive index of the third material be similar to that of either the first or second material. A final layer of the third material is deposited as the top layer of the filter (where allowed by the application) or over the top layer (where the last layer is composed of either the first or second material).

Figure 4A:
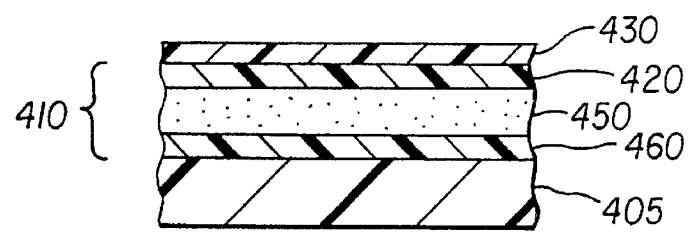
FIGS. 4A–G are sectional views illustrating the steps required in a preferred method for patterning a multilayer, dielectric color filter according to the present invention.
Figure 4B:
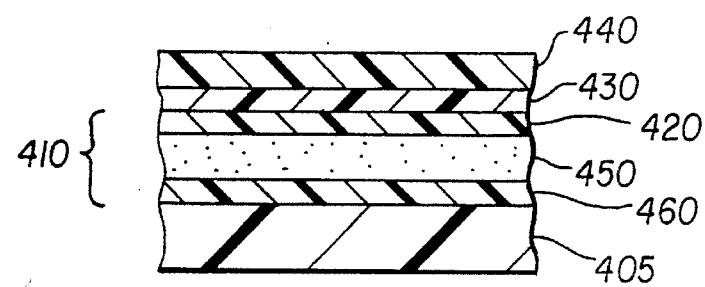
Figure 4C:
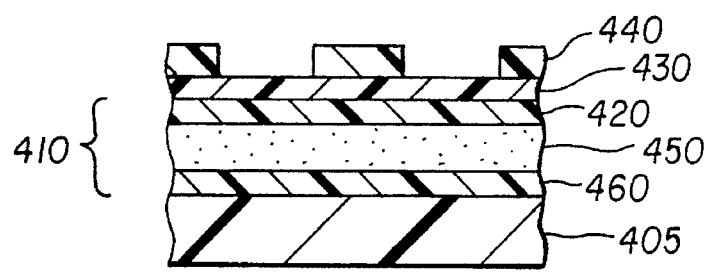
Figure 4D:
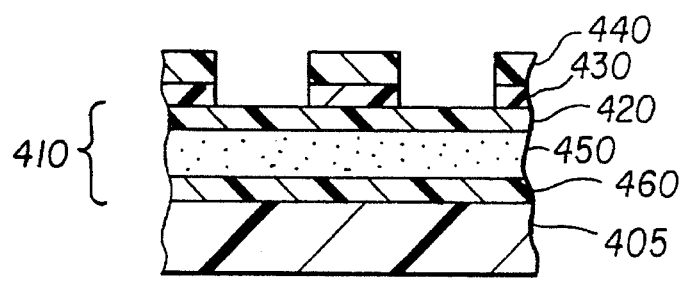
Figure 4E:
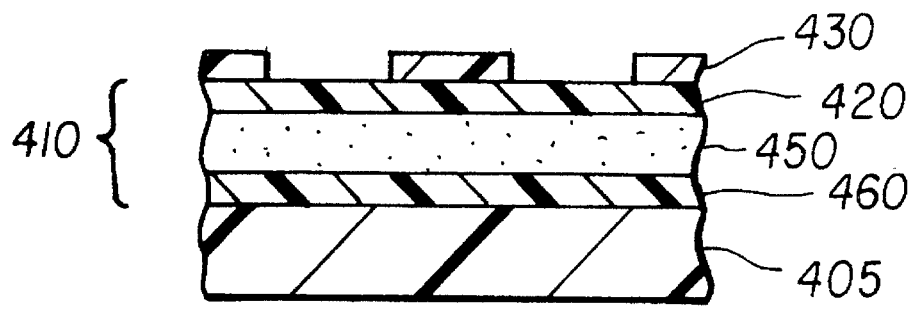
Figure 4F:
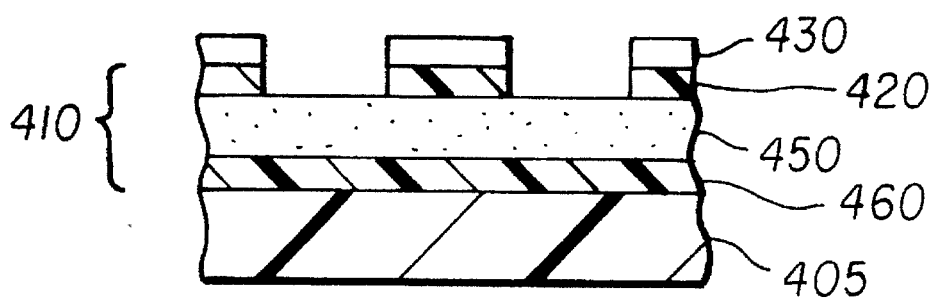
Figure 4G:
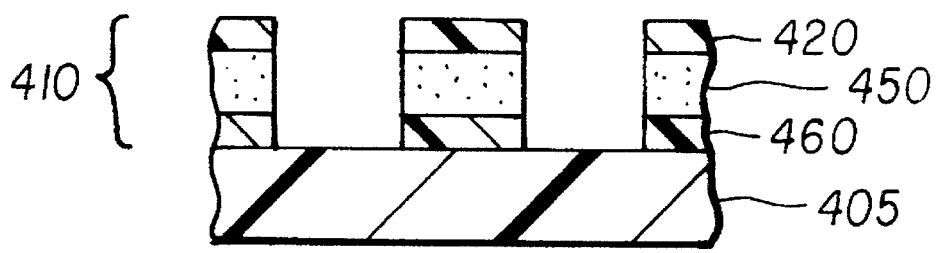

The process by which a filter is patterned begins with the application of a layer of the third material 430 over the top layer 420 of multilayer, dielectric color filter 410 on suitable substrate 405 (FIG. 4A). (It is assumed for this discussion that the layer 430 is not the top layer of multilayer, dielectric color filter 410 although where allowed by the application it could be.) A photoresist layer 440 is applied over this layer (FIG. 4B). In this description the top layer 420 of multilayer, dielectric color filter 410 is assumed, for convenience, to be composed of the first material (with a layer of the second material beneath). The bottom layer 460 of the filter is composed of the third material as is the layer 430 which covers the top of the filter. The photoresist layer 440 is patterned using standard photolithographic procedures to provide selected openings to layer 430 of the third material (FIG. 4C). A first dry etch is used to remove layer 430 where exposed through the openings in photoresist layer 440 (FIG. 4D). This etch does not attack the patterned mask (appreciably) or top layer 420. For a third material composed of indium oxide ($In_2O_3$) or indium-tin-oxide (ITO), a hydrocarbon containing reactive gas, e.g., methane ($CH_4$), is suitable to remove this layer by reactive ion etching (RIE). A second dry etch (RIE, plasma etch or other suitable process) using oxygen ($O_2$) as the reactive gas is used to remove the photoresist layer 440 and any amorphous carbon (a-C:H) (not shown) which accumulates on top of this layer during the first dry etch (FIG. 4E). This etch does not attack either layer 430 or the exposed regions of top layer 420. The second dry etch is followed by a third dry etch which removes top layer 420 and the alternate layers of the first and second materials 450 down to the bottom layer 460 which is composed of the third material (FIG. 4F). This etch does not attack bottom layer 460. For first and second materials composed of $TiO_2/SiO_2$ a gas mixture containing $CF_4$ and $O_2$ has been used successfully in RIE. For first and second materials composed of $Ta_2O_5/SiO_2$ a gas mixture containing $CHF_3$ and $O_2$ has been used successfully in RIE. Other fluorocarbon gases or fluorine containing gas mixtures not investigated may also prove useful to etch such $TiO_2/SiO_2$ and $Ta_2O_5/SiO_2$ multilayer structures. The first dry etch is used again to remove bottom layer 460 where exposed through the openings in layer 430, together with the remainder of layer 430 (FIG. 4G). (When layer 430 is incorporated as the top layer of multilayer, dielectric color filter 410 this step is not necessary.) Finally, the second dry etch is again used, this time to remove the amorphous carbon (a-C:H), if any, which deposits on the filter during over etch.

Subsequent to the patterning of the photoresist layer 440 the opportunity exists with this invention to complete the patterning of multilayer, dielectric color filters during a single vacuum pumpdown, in a single dry etch system, solely by changing reactive gas and etch conditions.

The nonlimiting examples below demonstrate and further describe the present invention.

EXAMPLE 1

A red filter composed of 42 alternate layers of $TiO_2$ and $SiO_2$ was deposited by e-beam evaporation onto a silicon (Si) substrate. Total thickness of this filter was 2.6 µm. On top of this filter was deposited a layer of indium-tin-oxide (ITO), 0.1 µm thick, by rf sputtering from an ITO target in argon (Ar) ambient at a pressure of 5 mTorr and a power density of 0.31 W/cm². Rf sputtering was employed to apply this layer to avoid contamination of the e-beam evaporator, which was needed to provide dielectric coatings for a production process. (Experiments have shown the etch rates of indium oxide and ITO to be similar between coatings deposited by rf sputtering and e-beam evaporation for the gas mixtures and RIE process conditions investigated.) On top of the layer of ITO a layer of photoresist (KTI 895i), 0.8 µm thick, was applied and patterned. The Si substrate with red filter was subjected to a reactive ion etch (RIE) using methane ($CH_4$) as the reactive gas at a pressure of 1 mTorr and a power density of 0.55 W/cm² for 25 minutes. The ITO was removed in all regions not covered by the photoresist. The photoresist and amorphous carbon (a-C:H) (which deposits on top of the photoresist, during the RIE in methane ($CH_4$), and in the bottom of the etch features on $TiO_2$ or $SiO_2$, during an over etch) were removed by RIE using $O_2$ at a pressure of 1 mTorr and a power density of 0.55 W/cm² for 30 minutes. Next the filter was subjected to a reactive ion etch (RIE) in a $CF_4/O_2$ gas mixture ($O_2$: 5% by volume) at a pressure of 20 mTorr and a power density of 0.33 W/cm² for 40 minutes. Depth of the etch was 2.6 µm. The etch was stopped by time at the Si/filter interface. ITO was not incorporated as the bottom layer in this example. Its suitability as an etch-stop is demonstrated, however, through its use as the patterned overlayer. No 'grass' or residue from unreacted etch products were present in the etch features. As the etch rate of the ITO under the conditions specified is virtually unmeasureable, little erosion of the ITO overlayer (mask) was observed and near vertical sidewalls with a taper of less than 0.2 µm (horizontal offset, top-to-bottom of edge) were obtained. Although significant differences exist between the etch rates of $TiO_2$ and $SiO_2$ under the process conditions specified, the resultant etch features were completely flat and smooth across the bottom with no visible sign (in Scanning Electron Microscope photographs) of etch induced roughness. Also, the sidewalls of the filter showed no evidence of scalloping which might be expected from an etch of this type through materials having dissimilar etch rates.

EXAMPLE 2

A red filter composed of 42 alternate layers of $Ta_2O_5$ and $SiO_2$ was deposited by e-beam evaporation onto a Si substrate. Total thickness of this filter was 3.2 µm. On top of this filter was deposited a layer of indium-tin-oxide (ITO), 0.325 µm thick, again by rf sputtering from an ITO target in Ar ambient at a pressure of 5 mTorr and a power density of 0.31 W/cm². On top of this layer a layer of photoresist (KTI 895i), 0.8 µm thick, was applied and patterned. The substrate with red filter was subjected to a reactive ion etch (RIE) using methane ($CH_4$) as the reactive gas at a pressure of 1 mTorr and a power density of 0.55 W/cm² for 64 minutes. The ITO was removed in all regions not covered by photoresist. The photoresist and amorphous carbon were removed by RIE using $O_2$ at a pressure of 1 mTorr and a power density of 0.55 W/cm² for 72 minutes. Next, the filter was subjected to a reactive ion etch (RIE) in a $CHF_3/O_2$ gas mixture ($O_2$: 5% by volume) at a pressure of 30 mTorr and a power density of 0.37 W/cm² for 85 minutes. Depth of the etch was 3.2 µm. This etch was again timed to stop at the Si/filter interface as an ITO layer was not incorporated as the bottom layer. (Subsequent to this example multilayer, dielectric color filters have been formed and patterned using ITO as the bottom layer.) Features appeared similar to those described in Example 1. No 'grass' or residue from unreacted etch products were present. Again, the etch rate of the ITO was nearly unmeasureable under the conditions specified. Little erosion of the ITO overlayer (mask) was observed and near vertical sidewalls with a sidewall taper of less than 0.3 μm (horizontal offset, top-to-bottom of edge) were obtained.

The above examples demonstrate the key aspects of the claimed invention, namely, that a third material (e.g., $In_2O_3$ or ITO) can be incorporated in multilayer, dielectric color filters containing multiple alternate layers of $TiO_2/SiO_2$ or $Ta_2O_5/SiO_2$ and used as a mask and integral, etch-stop layer (or layers) during dry etch processing to pattern filters of small area. Dry etch processing (first dry etch) can be used also to remove the remainder of this third material where desired without requiring use of a wet etch. The process conditions used in above examples were selected only to avoid the formation of 'grass' and etch induced roughness in the resultant etch features and were not optimized.

The invention has been described in detail with particular reference to certain preferred embodiments thereof, but it will be understood that variations and modifications can be effected within the spirit and scope of the invention. For example, the multilayer, dielectric color filters made in accordance with this invention can be used with a number of devices in addition to their use with solid-state image sensors such as, projection systems, displays such as liquid crystal displays, and printers. The filters can be applied directly onto a device or onto a glass substrate for subsequent attachment to the device. Also, in accordance with this invention a plurality of multilayer, dielectric color filters of different colors in one-dimensional or two-dimensional patterns can be provided on devices or glass substrates by applying the invention in sequence once for each color. To improve the resolution and edge definition achievable by this invention a thin, inorganic layer (e.g., of $SiO_2$, $TiO_2$, or $Ta_2O_5$) can be provided on top of the upper, inorganic etch-stop layer. This layer can be patterned by a dry etch (e.g., RIE) process which does not attack the etch-stop layer through a photopatternable mask such as photoresist. Such a layer would be less subject than photoresist to erosion of feature edges induced by dry etch processing.

PARTS LIST

| | |
|---|---|
| 110 | photoresist |
| 120 | substrate |
| 130 | multilayer, dielectric color filter |
| 210 | multilayer, dielectric color filter |
| 220 | substrate |
| 230 | patterned mask |
| 310 | multiple alternate layers |
| 320 | high refractive index |
| 330 | low refractive index |
| 340 | substrate |
| 350 | layer of third material |
| 405 | substrate |
| 410 | multilayer, dielectric color filter |
| 420 | top layer |
| 430 | layer of third material |
| 440 | photoresist layer |
| 450 | alternate layers of first and second materials |
| 460 | bottom layer of multilayer, dielectric color filter |

We claim:

1. A method of patterning a multilayer, dielectric color filter comprising the steps of:

a) depositing a multilayer, dielectric color filter on a substrate having top, bottom and multiple intermediate layers;

b) applying a patternable mask onto the top layer of the multilayer, dielectric color filter to provide selected openings through the mask;

c) removing the top layer of the multilayer, dielectric color filter through the selected openings in the patterned mask, the patterned mask and the multiple intermediate layers of the filter being resistant to the process used for removing the top layer, to provide openings to the multiple intermediate layers of the filter; and d) removing, through the openings in the top layer, the multiple intermediate layers of the filter, down to the bottom layer, the top layer and bottom layer being resistant to the process used for removing the intermediate layers.

2. The method of claim 1 wherein the top layer is removed by a first dry etch and the multiple intermediate layers are removed using a second dry etch.

3. The method as set forth in claim 2 wherein the first dry etch utilizes a reactive hydrocarbon gas or hydrocarbon gas mixture.

4. The method as set forth in claim 3 wherein the reactive hydrocarbon gas is methane ($CH_4$).

5. The method as set forth in claim 2 wherein the second dry etch utilizes a reactive fluorocarbon gas or fluorocarbon containing gas mixture.

6. The method as set forth in claim 5 wherein the reactive fluorocarbon gas is $CF_4$ or $CHF_3$.

7. The method as set forth in claim 2 wherein the bottom layer is removed through the openings in the top layer, along with the top layer, using the first dry etch.

8. The method as set forth in claim 7 wherein a dry etch is used following removal of the bottom layer to remove a residual deposit.

9. The method as set forth in claim 8 wherein the first dry etch utilizes a reactive hydrocarbon gas or hydrocarbon gas mixture.

10. The method as set forth in claim 9 wherein the residual deposit is composed of amorphous carbon (a-C:H).

11. A multilayer, dielectric color filter made according to the method of claim 7.

12. The multilayer, dielectric color filter as set forth in claim 11 wherein the multiple intermediate layers are composed of alternate layers of silicon dioxide ($SiO_2$) and titanium dioxide ($TiO_2$) or alternate layers of silicon dioxide ($SiO_2$) and tantalum pentoxide ($Ta_2O_5$).

13. The multilayer, dielectric color filter as set forth in claim 11 wherein the bottom layer is composed of indium oxide (In2O3) or indium-tin-oxide (ITO).

14. A multilayer, dielectric color filter made according to the method of claim 1.

15. The multilayer, dielectric color filter as set forth in claim 14 wherein the multiple intermediate layers are composed of alternate layers of silicon dioxide ($SiO_2$) and titanium dioxide ($TiO_2$) or alternate layers of silicon dioxide ($SiO_2$) and tantalum pentoxide ($Ta_2O_5$).

16. The multilayer, dielectric color filter as set forth in claim 14 wherein the bottom layer is composed of indium oxide ($In_2O_3$) or indium-tin-oxide (ITO).

17. The multilayer, dielectric color filter as set forth in claim 14 wherein the top layer is composed of indium oxide ($In_2O_3$) or indium-tin-oxide (ITO).

18. The method as set forth in claim 1 including the step of removing the patterned mask using a dry etch, the top layer and multiple intermediate layers of the filter being resistant to this dry etch.

19. The method as set forth in claim 18 wherein the dry etch utilizes oxygen ($O_2$) or an oxygen containing gas mixture.

20. The method as set forth in claim 1 wherein the patternable mask applied onto the top layer is composed of a photopatternable material such as photoresist.

* * * * *